(12) United States Patent
Park et al.

(10) Patent No.: US 11,401,290 B2
(45) Date of Patent: Aug. 2, 2022

(54) COBALT PRECURSOR, METHOD OF PREPARING SAME AND METHOD OF MANUFACTURING THIN FILM USING SAME

(71) Applicant: HANSOL CHEMICAL CO., LTD., Seoul (KR)

(72) Inventors: Jung-Woo Park, Seoul (KR); Jang-Hyeon Seok, Sejong-si (KR); Hyo-Suk Kim, Jeollabuk-do (KR); Ming-Sung Park, Daejeon (KR)

(73) Assignee: HANSOL CHEMICAL CO., LTD., Seoul (KR)

( * ) Notice: Subject to any disclaimer, the term of this patent is extended or adjusted under 35 U.S.C. 154(b) by 250 days.

(21) Appl. No.: 16/627,243

(22) PCT Filed: Dec. 27, 2018

(86) PCT No.: PCT/KR2018/016739
§ 371 (c)(1),
(2) Date: Dec. 27, 2019

(87) PCT Pub. No.: WO2020/130215
PCT Pub. Date: Jun. 25, 2020

(65) Prior Publication Data
US 2021/0332074 A1     Oct. 28, 2021

(30) Foreign Application Priority Data
Dec. 19, 2018   (KR) .......................... 10-2018-0165373

(51) Int. Cl.
*C07F 15/06* (2006.01)
*C23C 16/18* (2006.01)
*C23C 16/455* (2006.01)

(52) U.S. Cl.
CPC .............. *C07F 15/06* (2013.01); *C23C 16/18* (2013.01); *C23C 16/45553* (2013.01)

(58) Field of Classification Search
CPC .... C07F 15/06; C23C 16/18; C23C 16/45553
See application file for complete search history.

(56) References Cited

U.S. PATENT DOCUMENTS

| 9,416,443 B2 | 8/2016 | Gatineau et al. |
| 10,253,408 B2 | 4/2019 | Yoshino et al. |
| 2018/0051372 A1* | 2/2018 | Yoshino ................ C07F 15/065 |

FOREIGN PATENT DOCUMENTS

| JP | 2017-007952 A | 1/2017 |
| KR | 10-2004-0033337 A | 4/2004 |
| KR | 10-2010-0061183 A | 6/2010 |
| KR | 2010-0061183 A | 6/2010 |
| KR | 10-2012-0053479 A | 4/2017 |
| KR | 10-2018-0022775 A | 4/2018 |

OTHER PUBLICATIONS

Pugh (Inorganic Chemistry; 2013, 52, 13719-13729).*
Song, Y.W., et al., "Atomic Layer Deposition of Ru by Using a New Ru-precursor", ECS Transactions, 2006.

* cited by examiner

*Primary Examiner* — Pancham Bakshi
(74) *Attorney, Agent, or Firm* — Venable LLP

(57) ABSTRACT

The present invention relates to a vapor deposition compound enabling thin-film deposition through vapor deposition, and more particularly to a novel cobalt precursor, which can be applied to atomic layer deposition (ALD) or chemical vapor deposition (CVD) and exhibits superior reactivity, volatility and thermal stability, a method of preparing the same and a method of manufacturing a thin film using the same.

7 Claims, No Drawings

COBALT PRECURSOR, METHOD OF PREPARING SAME AND METHOD OF MANUFACTURING THIN FILM USING SAME

The present application is a national-stage entry under 35 U.S.C. § 371 of International Patent Application No. PCT/KR2018/016739, filed Dec. 27, 2018, which claims priority to Korean Patent Application No. 10-2018-0165373, filed Dec. 19, 2018, the entire disclosure of each of which is incorporated by reference herein.

TECHNICAL FIELD

The present invention relates to a vapor deposition compound enabling thin-film deposition through vapor deposition, and more particularly to a novel cobalt precursor, which may be applied to atomic layer deposition (ALD) or chemical vapor deposition (CVD) and exhibits superior reactivity, volatility and thermal stability, a method of preparing the same, and a method of manufacturing a thin film using the same.

BACKGROUND ART

In an atomic layer deposition (ALD) process or a chemical vapor deposition (CVD) process of forming an insulating film, a conductive thin film, or the like through a surface reaction using a precursor on a wafer, the selection of an appropriate precursor is regarded as very important, along with the process apparatus.

In the case of cobalt, there is no problem of increasing contact resistance due to the formation of cobalt boride (CoB), and moreover, relatively low resistivity when forming a cobalt silicide layer may be exhibited, and superior thermal stability may also be exhibited, and thus research is ongoing into the use of cobalt silicide as an ohmic contact layer in next-generation semiconductor processes.

In particular, as the extent of integration of semiconductor devices increases and the structure thereof becomes more complicated, a cobalt thin film having a structure having a high aspect ratio and superior step coverage is required.

Moreover, a cobalt oxide thin film is expected to be useful in various fields such as those of magnetic detectors, moisture sensors, oxygen sensors and superconductors. In addition, studies have been actively conducted with the goal of improving the adhesion between a copper thin film and a diffusion barrier layer using a metal cobalt thin film as an adhesive layer.

Examples of a generally used precursor compound for cobalt deposition broadly include $Co(CO)_3(NO)$ [cobalt tricarbonyl nitrosyl], $Co(CO)_2Cp$ [cobalt dicarbonyl cyclopentadienyl], $Co_2(CO)_8$ [dicobalt octacarbonyl], $CoCp_2$ [bis-cyclopentadienyl cobalt], and the like.

Of these, $Co(CO)_3(NO)$ or $Co(CO)_2Cp$ compounds are liquid at room temperature and have the advantage of considerably high vapor pressure, but cause many difficulties during processing because they are thermally unstable, exhibiting pyrolysis at room temperature. Also, $Co_2(CO)_8$ and $CoCp_2$ compounds are solid at room temperature and have relatively low vapor pressure, making them more difficult to apply to processing than the compounds $Co(CO)_3(NO)$ and $Co(CO)_2Cp$.

Moreover, cyclopentadienyl-based compounds are problematic because of relatively high deposition temperatures of 300° C. or more and severe carbon contamination caused by the decomposition of the ligand.

In order to solve these problems, studies on cobalt precursors including diazadiene (DAD) ligands containing C=N double bonds or precursors including neutral ligands are underway, but there is an urgent need for research into cobalt precursors having superior reactivity, volatility and thermal stability, which may be utilized in various deposition processes.

SUMMARY OF THE INVENTION

Accordingly, the present invention has been devised keeping in mind the problems of cobalt precursors encountered in the related art, and an objective of the present invention is to provide a cobalt precursor compound suitable for use in thin-film deposition, having superior reactivity, thermal stability and volatility.

Another objective of the present invention is to provide a method of manufacturing a thin film using the cobalt precursor compound.

However, the objectives of the present invention are not limited to the foregoing, and other objectives not mentioned herein may be clearly understood by those skilled in the art through the following description.

DETAILED DESCRIPTION

Upon deposition of a cobalt thin film (particularly, a cobalt metal thin film), when using a monovalent or divalent cobalt ($Co^{1+}$, $Co^{2+}$) precursor, hydrogen gas has to be used, or thin-film contamination may be caused, which is undesirable.

In contrast, when using a zerovalent cobalt compound precursor, problems that may occur due to the use of the monovalent or divalent cobalt ($Co^{1+}$,$+Co^{2+}$) precursor may be overcome but a zerovalent cobalt compound precursor is still unknown.

A diazadiene (DAD) ligand containing a C=N double bond may bind to a metal in various forms, such as zerovalent, monovalent and divalent forms, and when the ligand acts in the zerovalent form, it is deemed to be a ligand suitable for forming a cobalt thin film.

In particular, a neutral ligand, which is able to donate electrons to the Co(DAD) skeleton, is introduced to thus occupy the empty site around the cobalt metal, thereby stabilizing the compound, ultimately obtaining a novel cobalt precursor which is liquid at room temperature and exhibits reactivity, volatility and thermal stability superior to those of conventional cobalt precursor compounds.

An aspect of the present invention provides a compound represented by Chemical Formula 1 below.

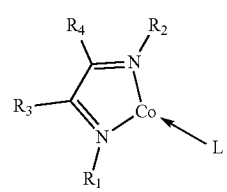

[Chemical Formula 1]

In Chemical Formula 1, $R_1$, $R_2$, $R_3$ and $R_4$ are each independently hydrogen, a substituted or unsubstituted C1-C6 linear or branched saturated or unsaturated alkyl group or isomers thereof, and L is a neutral ligand containing an electron pair or a multiple bond.

Another aspect of the present invention provides a vapor deposition precursor including the above compound.

Still another aspect of the present invention provides a method of manufacturing a thin film, including introducing the vapor deposition precursor into a chamber.

According to the present invention, a novel vapor deposition cobalt compound and a precursor including the vapor deposition compound are superior in view of reactivity, volatility and thermal stability, thus enabling thin-film deposition at high temperatures and preventing side reactions from occurring during processing by virtue of the lower incidence of residue attributable to heat loss.

Moreover, the vapor deposition precursor of the present invention has low viscosity and a low vaporization rate, thus enabling uniform thin-film deposition, thereby making it possible to attain superior thin-film properties, thickness and step coverage.

These properties are capable of providing a precursor suitable for use in atomic layer deposition (ALD) or chemical vapor deposition (CVD), and contribute to superior thin-film characteristics.

According to the present invention, a novel cobalt precursor may be prepared through a synthesis reaction represented in Chemical Scheme 1 below.

Specifically, a cobalt compound (CoX$_2$) substituted with a halogen element (X) and a diazadiene (DAD) ligand compound containing a C=N double bond are allowed to react, thus synthesizing a compound having a Co(DAD) skeleton. Then, a neutral ligand containing an electron pair or a multiple bond able to donate electrons to the Co(DAD) skeleton is introduced thereto, whereby a novel cobalt precursor is synthesized.

Chemical Scheme 1

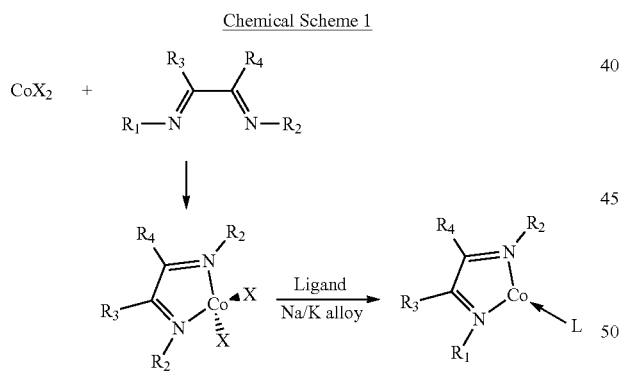

In Chemical Scheme 1, X is a halogen element, $R_1$, $R_2$, $R_3$ and $R_4$ are each independently hydrogen, a substituted or unsubstituted C1-C6 linear or branched saturated or unsaturated alkyl group or isomers thereof, and L is a neutral ligand containing an electron pair or a multiple bond.

Hereinafter, embodiments and examples of the present invention will be described in detail so that those skilled in the art can easily carry out the present invention. However, the present invention may be modified in a variety of different forms, and is not limited to the embodiments and examples herein.

An aspect of the present invention pertains to a compound represented by Chemical Formula 1 below.

[Chemical Formula 1]

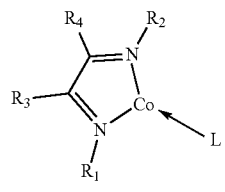

In Chemical Formula 1, preferably, $R_1$, $R_2$, $R_3$ and $R_4$ are each independently hydrogen, a substituted or unsubstituted C1-C6 linear or branched saturated or unsaturated alkyl group or isomers thereof, and L is a neutral ligand containing an electron pair or a multiple bond.

In an embodiment of the present invention, more preferably, $R_1$, $R_2$, $R_3$ and $R_4$ are each any one selected from the group consisting of hydrogen, a methyl group, an ethyl group, an n-propyl group, an iso-propyl group, an n-butyl group, an iso-butyl group, a sec-butyl group, a tert-butyl group and isomers thereof, but the present invention is not limited thereto.

In an embodiment of the present invention, more preferably, L is any one selected from the group consisting of ligands including carbonyl (CO), nitrosyl (NO), cyan (CN), isocyanide, nitrile, alkyne, alkene, diene and triene, but the present invention is not limited thereto.

In an embodiment of the present invention, more preferably, L has, but is not limited to, the following structure.
1) Alkyne: $R_1'$—C≡C—$R_2'$
2) Alkene: $R_3'R_4'$C=C$R_5'R_6'$
3) Diene: $R_7'R_8'$C=C$R_9'$—C$R_{10}'$=C$R_{11}'R_{12}'$
4) Triene: $R_{13}'R_{14}'$C=C$R_{15}'$—C$R_{16}'$=C$R_{17}'$—C$R_{18}'$=C$R_{19}'R_{20}'$
5) Cyclic diene: 1,3(1,4)-cyclohexadiene, 1,3(1,4)-cycloheptadiene, cyclopentadiene, 1,5-cyclooctadiene, 1,5-dimethyl-1,5-cyclooctadiene
6) Cyclic triene: 1,3,5-cycloheptadiene
7) Isocyanide: $R_{21}'$—NC
8) Alkyl nitrile: $R_{22}'$—CN In 1) to 8) above, $R_1'$ to $R_{22}'$ are each independently preferably hydrogen, a substituted or unsubstituted C1-C6 linear or branched saturated or unsaturated alkyl group or isomers thereof.

In an embodiment of the present invention, the compound described above may be a liquid at room temperature, but the present invention is not limited thereto.

In a preferred embodiment of the present invention, the compound represented by Chemical Formula 1 may be a compound represented by Chemical Formula 1-1 below.

Chemical Formula 1-1

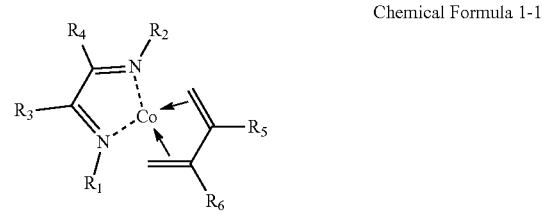

In Chemical Formula 1-1, $R_1$, $R_2$, $R_3$ and $R_4$ are the same as in Chemical Formula 1, and $R_5$ and $R_6$ are each independently hydrogen, a substituted or unsubstituted C1-C3 linear or branched saturated or unsaturated alkyl group or isomers thereof.

Another aspect of the present invention pertains to a vapor deposition precursor including the compound described above.

Still another aspect of the present invention pertains to a method of manufacturing a thin film, the method including introducing the vapor deposition precursor of the present invention into a chamber. The introducing the vapor deposition precursor into the chamber may include physical adsorption, chemical adsorption, or physical and chemical adsorption.

In an embodiment of the present invention, the method of manufacturing the thin film may include both of atomic layer deposition (ALD), in which the vapor deposition precursor of the present invention and a reaction gas are sequentially introduced, and chemical vapor deposition (CVD), in which the vapor deposition precursor of the present invention and a reaction gas are continuously introduced to form a film.

More specifically, examples of the deposition process may include, but are not limited to, metal organic chemical vapor deposition (MOCVD), low-pressure chemical vapor deposition (LPCVD), pulsed chemical vapor deposition (P-CVD), plasma-enhanced atomic layer deposition (PE-ALD), and combinations thereof.

In an embodiment of the present invention, the method of manufacturing the thin film may further include feeding at least one reaction gas selected from among hydrogen ($H_2$), an oxygen (O)-atom-containing compound (or mixture), a nitrogen (N)-atom-containing compound (or mixture) and a silicon (Si)-atom-containing compound (or mixture).

More specifically, at least one selected from among water ($H_2O$), oxygen ($O_2$), hydrogen ($H_2$), ozone ($O_3$), ammonia ($NH_3$), hydrazine ($N_2H_4$) and silane may be used as the reaction gas, but the present invention is not limited thereto.

Particularly, in order to deposit a cobalt oxide thin film, water vapor ($H_2O$), oxygen ($O_2$), and ozone ($O_3$) may be used as the reaction gas, and in order to deposit a cobalt nitride thin film, ammonia ($NH_3$) or hydrazine ($N_2H_4$) may be used as the reaction gas.

Also, in order to deposit a metal cobalt thin film, hydrogen ($H_2$) or a silane-based compound may be used as the reaction gas, and in order to deposit a cobalt silicide (CoSi or $CoSi_2$) thin film, hydrogen ($H_2$) or a silane-based compound may be used as the reaction gas.

Examples of the thin film manufactured by the above method may include a cobalt metal thin film, a cobalt oxide thin film, a cobalt nitride thin film and a cobalt silicide thin film, but the present invention is not limited thereto.

A better understanding of the present invention will be given through the following examples, which are not to be construed as limiting the present invention.

The novel cobalt precursor of the present invention may be prepared through a synthesis reaction represented in Chemical Scheme 1 below.

Specifically, a cobalt compound ($CoX_2$) substituted with a halogen element (X) and a diazadiene (DAD) ligand compound containing a C=N double bond are allowed to react, thus synthesizing a compound having a Co(DAD) skeleton. Then, a neutral ligand containing an electron pair or a multiple bond able to donate electrons to the Co(DAD) skeleton is introduced thereto, thereby synthesizing a novel cobalt precursor.

[Chemical Scheme 1]

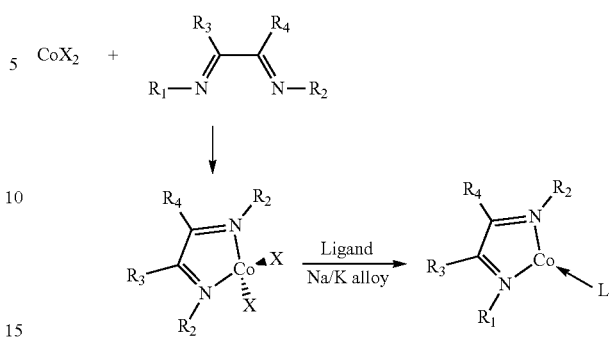

In Chemical Scheme 1, X is a halogen element, $R_1$, $R_2$, $R_3$ and $R_4$ are each independently hydrogen, a substituted or unsubstituted C1-C6 linear or branched saturated or unsaturated alkyl group or isomers thereof, and L is a neutral ligand containing an electron pair or a multiple bond.

Example 1

Synthesis of $Co(DAD)Br_2$ Compound

In order to synthesize the $Co(DAD)Br_2$ compound represented in Chemical Scheme 2 below, $CoBr_2$ (1 equivalent weight) was placed in a THF solvent in a flask, stirred at a low temperature, and slowly added with a DAD ligand compound (1 equivalent weight) dissolved in a solvent. The resulting mixture was stirred overnight at room temperature. After termination of the reaction, the solvent was removed, thereby obtaining a solid compound.

The DAD ligand compound used in Example 1 was a compound in which $R_1$ and $R_2$ were each independently isopropyl (iPr) or tert-butyl (tBu), and $R_3$ and $R_4$ were each independently hydrogen (H), methyl (Me) or ethyl (Et) in Chemical Scheme 2 below.

Example 2

Synthesis of Co(DAD)(Dienyl Ligand) Compound

As represented in Chemical Scheme 2 below, Na/K alloy (1 equivalent weight) was placed in THF in a flask, cooled to a low temperature, and then slowly added with the $Co(DAD)Br_2$ (1 equivalent weight) synthesized in Example 1 dissolved in a solvent. The resulting mixture was added with a dienyl ligand compound serving as a neutral ligand, and was then stirred overnight at room temperature. After termination of the reaction, the mixture was filtered under reduced pressure and the solvent was removed therefrom.

The compound thus obtained was dissolved again in pentane, filtered under reduced pressure and the solvent was removed therefrom, followed by purification through distillation or sublimation, thereby yielding a pure compound.

The dienyl ligand compound used in Example 2 was a compound in which $R_5$ and $R_6$ were each independently hydrogen or methyl (Me) in Chemical Scheme 2 below.

[Chemical Scheme 2]

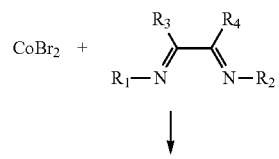

-continued

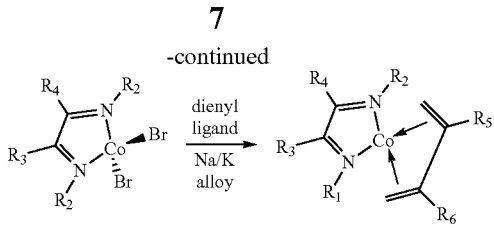

Preparation Example 1

A cobalt thin film was manufactured through chemical vapor deposition (CVD).

The precursor, in which the novel cobalt precursor of Example 1 or 2 was contained in a concentration of 0.02 M in octane, was used as a starting precursor solution. In order to vaporize the precursor solution, it was transferred into a vaporizer at a temperature of 50 to 150° C. at a flow rate of 0.1 cc/min. The precursor thus vaporized was transferred into a deposition chamber using 50 to 300 sccm helium (carrier gas). Hydrogen ($H_2$) was used as a reaction gas, and was supplied into the deposition chamber at a flow rate of 1 L/min (1 pm). The pressure of the deposition chamber was adjusted to the range of 1 to 20 torr, and the deposition temperature was adjusted to the range of 80 to 300° C. Under these conditions, a deposition process was performed for about 15 min.

Preparation Example 2

A cobalt thin film was manufactured through atomic layer deposition (ALD).

The novel cobalt precursor of Example 1 or 2 and a reaction gas containing oxygen ($O_2$) were alternately supplied onto a substrate, thus manufacturing a cobalt thin film. After the supply of the precursor and the reaction gas, argon was supplied as a purging gas to purge the precursor and the reaction gas remaining in the deposition chamber. The precursor supply time was adjusted to the range of 8 to 15 sec and the reaction gas supply time was adjusted to the range of 8 to 15 sec. The pressure of the deposition chamber was adjusted to the range of 1 to 20 torr and the deposition temperature was adjusted to the range of 80 to 300° C.

Preparation Example 3

A cobalt thin film was manufactured through atomic layer deposition (ALD).

A p-type Si (100) wafer having a resistance of 0.02 Ωm was used. Before deposition, the p-type Si wafer was cleaned through sonication for 10 min in each of acetone, ethanol and deionized (DI) water. The oxide thin film naturally formed on the Si wafer was immersed in a 10% HF ($HF:H_2O=1:9$) solution for 10 sec and thus removed.

[Co(DAD)(dienyl ligand) precursor] (10 sec/15 sec), [Ar] (10 to 30 sec), [$O_3$] (5 sec/8 sec/10 sec), and [Ar] (10 to 30 sec) were sequentially supplied, and the flow rate of argon (Ar) for purging was 1000 sccm. The reaction gas was 224 g/cm³ of ozone ($O_3$). Each reaction gas was fed through on/off control of a pneumatic valve, and a film was formed at a processing temperature of 80 to 300° C.

A conventional cobalt compound was difficult to use as a precursor due to instability at room temperature. In contrast, the novel cobalt precursor according to the present invention, including both the diazadiene (DAD) ligand and the neutral ligand, advantageously exhibits relatively high thermal stability and high reactivity with oxidative reaction gas.

Moreover, uniform thin-film deposition becomes possible using the novel cobalt precursor according to the present invention, including both the diazadiene (DAD) ligand and the neutral ligand, thereby attaining superior thin-film properties, thickness and step coverage.

The scope of the invention is represented by the claims below rather than the aforementioned detailed description, and all changes or modified forms that are capable of being derived from the meaning, range, and equivalent concepts of the appended claims should be construed as being included in the scope of the present invention.

The present invention pertains to a vapor deposition compound that enables thin-film deposition through vapor deposition, and particularly, the compound of the present invention can be applied to atomic layer deposition (ALD) or chemical vapor deposition (CVD) and is superior in view of reactivity, volatility and thermal stability, thus enabling thin-film deposition at high temperatures and preventing side reactions from occurring during processing by virtue of the lower incidence of residue attributable to heat loss.

Moreover, the vapor deposition precursor of the present invention has low viscosity and a low vaporization rate to thus enable uniform thin-film deposition, thereby making it possible to attain superior thin-film properties, thickness and step coverage.

These properties are capable of providing a precursor suitable for use in atomic layer deposition (ALD) or chemical vapor deposition (CVD), and contribute to superior thin-film characteristics.

The invention claimed is:

1. A compound represented by Chemical Formula 1 below:

[Chemical Formula 1]

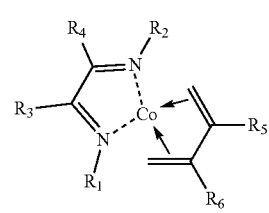

in Chemical Formula 1,
$R_1$, $R_2$, $R_3$ and $R_4$ are each independently hydrogen or unsubstituted C1-C6 linear or branched alkyl group, and
$R_5$ and $R_6$ are each independently hydrogen or unsubstituted C1-C3 linear or branched alkyl group.

2. The compound of claim 1, wherein $R_1$, $R_2$, $R_3$ and $R_4$ are each any one selected from the group consisting of hydrogen, a methyl group, an ethyl group, an n-propyl group, an iso-propyl group, an n-butyl group, an iso-butyl group, a sec-butyl group, and a tert-butyl group.

3. A vapor deposition precursor comprising the compound of claim 1.

4. A method of manufacturing a thin film, the method comprising:
introducing the vapor deposition precursor of claim 3 into a chamber.

5. The method of claim 4, wherein the method of manufacturing the thin film includes atomic layer deposition (ALD) or chemical vapor deposition (CVD).

6. The method of claim 4, further comprising feeding, as a reaction gas, at least one selected from among hydrogen ($H_2$), an oxygen (O)-atom-containing compound, a nitrogen (N)-atom-containing compound and a silicon (Si)-atom-containing compound.

7. The method of claim 6, wherein the reaction gas is at least one selected from among water ($H_2O$), oxygen ($O_2$), hydrogen ($H_2$), ozone ($O_3$), ammonia ($NH_3$), hydrazine ($N_2H_4$) and silane.

\* \* \* \* \*